United States Patent
Wang et al.

(10) Patent No.: US 8,852,760 B2
(45) Date of Patent: Oct. 7, 2014

(54) FREE LAYER WITH HIGH THERMAL STABILITY FOR MAGNETIC DEVICE APPLICATIONS BY INSERTION OF A BORON DUSTING LAYER

(75) Inventors: Yu-Jen Wang, San Jose, CA (US); Witold Kula, Sunnyvale, CA (US); Ru-Ying Tong, Los Gatos, CA (US); Guenole Jan, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 97 days.

(21) Appl. No.: 13/448,557

(22) Filed: Apr. 17, 2012

(65) Prior Publication Data

US 2013/0270523 A1      Oct. 17, 2013

(51) Int. Cl.
   H01L 29/82   (2006.01)
   G01R 33/09   (2006.01)
   G11B 5/39    (2006.01)

(52) U.S. Cl.
   CPC ............ *G01R 33/091* (2013.01); *G11B 5/3906* (2013.01)
   USPC ................ 428/811.1; 428/811.5; 360/324.11; 360/324.12; 360/324.2; 257/421; 365/158; 365/171; 365/173

(58) Field of Classification Search
   None
   See application file for complete search history.

(56) References Cited

U.S. PATENT DOCUMENTS

| | | | |
|---|---|---|---|
| 6,909,630 B2 | 6/2005 | Tsang | |
| 7,276,384 B2 | 10/2007 | Parkin et al. | |
| 7,660,153 B2 * | 2/2010 | Yamane et al. | 365/171 |
| 8,492,859 B2 * | 7/2013 | Hu | 257/421 |
| 8,592,927 B2 * | 11/2013 | Jan et al. | 257/421 |
| 2005/0012127 A1 | 1/2005 | Worledge | |
| 2006/0042929 A1 | 3/2006 | Mauri | |
| 2007/0154740 A1 * | 7/2007 | Yuasa et al. | 428/812 |
| 2007/0268633 A1 | 11/2007 | Horng et al. | |
| 2008/0151442 A1 | 6/2008 | Mauri et al. | |
| 2008/0239591 A1 * | 10/2008 | Fuji et al. | 360/324.12 |
| 2009/0213503 A1 | 8/2009 | Sun et al. | |
| 2010/0090261 A1 | 4/2010 | Zheng et al. | |
| 2010/0109110 A1 | 5/2010 | Wang et al. | |
| 2011/0064969 A1 * | 3/2011 | Chen et al. | 428/800 |
| 2012/0038012 A1 * | 2/2012 | Zhao et al. | 257/421 |

(Continued)

OTHER PUBLICATIONS

PCT Search Report PCT/US2013/036851 Mailed: Aug. 20, 2013, Headway Technologies, Inc.

(Continued)

*Primary Examiner* — Kevin Bernatz
(74) *Attorney, Agent, or Firm* — Saile Ackerman LLC; Stephen B. Ackerman

(57) ABSTRACT

A boron or boron containing dusting layer such as CoB or FeB is formed along one or both of top and bottom surfaces of a free layer at interfaces with a tunnel barrier layer and capping layer to improve thermal stability while maintaining other magnetic properties of a MTJ stack. Each dusting layer has a thickness from 0.2 to 20 Angstroms and may be used as deposited, or at temperatures up to 400° C. or higher, or following a subsequent anneal at 400° C. or higher. The free layer may be a single layer of CoFe, Co, CoFeB or CoFeNiB, or may include a non-magnetic insertion layer. The resulting MTJ is suitable for STT-MRAM memory elements or spintronic devices. Perpendicular magnetic anisotropy is maintained in the free layer at temperatures up to 400° C. or higher. Ku enhancement is achieved and the retention time of a memory cell for STT-MRAM designs is increased.

17 Claims, 2 Drawing Sheets

(56) References Cited

U.S. PATENT DOCUMENTS

| | | | |
|---|---|---|---|
| 2012/0056285 A1* | 3/2012 | Bessho et al. | 257/421 |
| 2012/0075927 A1* | 3/2012 | Chen et al. | 365/173 |
| 2012/0199922 A1* | 8/2012 | Uchida et al. | 257/421 |
| 2012/0205758 A1* | 8/2012 | Jan et al. | 257/421 |
| 2013/0175644 A1* | 7/2013 | Horng et al. | 257/421 |
| 2013/0221459 A1* | 8/2013 | Jan et al. | 257/421 |
| 2013/0224521 A1* | 8/2013 | Wang et al. | 428/828 |
| 2013/0230741 A1* | 9/2013 | Wang et al. | 428/826 |

OTHER PUBLICATIONS

"Perpendicular Magnetic Anisotropy in CoFeB/Pd Bilayers," by Ciaran Fowley et al., IEEE Transactions on Magnetics, vol. 46, No. 6, Jun. 2010, pp. 2116-2118.

"Realization of CoFeB/MgO/CoFeB Magnetic Tunnel Junction Devices Through Materials Analysis, Process Integration and Circuit Simulation," by Sankha Subhra Mukherjee, A Dissertation, for the degree of Doctor of Philosophy in Microsystems Engineering at the Rochester Institute of Technology, Dec. 2009, pp. 1-190.

Co-pending US Patent HMG11-012, U.S. Appl. No. 13/406,972, filed Feb. 28, 2012, "High Thermal Stability Reference Structure with Out-of-Plane Anisotropy for Magnetic Device Applications," Wang et al., 36 pgs.

Co-pending US Patent HMG11-018, U.S. Appl. No. 13/409,456, filed Mar. 1, 2012, "High Thermal Stability Free Layer with High Out-of-Plane Anisotropy for Magnetic Device Applications," Wang et al., 32 pgs.

"Microwave Assited Magnetic Recording," by Jian-Gang Zhu et al., IEEE Transactions on Magnetics, vol. 44, No. 1, Jan. 2008, pp. 125-131.

"Current-driven Excitation of Magnetic Multilayers," by J.C. Slonczewski, Journal of Magnetism and Magnetic Materials, 159 (1996) L1-L7, Received Oct. 27, 1995; revised Dec. 19, 1995.

"Current-induced Magnetization Reversal in Nanopillars with Perpendicular Anisotropy," by S. Mangin et al., 206 Nature Publishing Group, nature 'materials, vol. 5, Mar. 2006, pp. 210-215, found: www.nature.com/naturematerials.

* cited by examiner

FREE LAYER WITH HIGH THERMAL STABILITY FOR MAGNETIC DEVICE APPLICATIONS BY INSERTION OF A BORON DUSTING LAYER

RELATED PATENT APPLICATIONS

This application is related to the following: Ser. No. 13/406,972, filing date Feb. 28, 2012; and Ser. No. 13/409,456, filing date Mar. 1, 2012; both assigned to a common assignee and herein incorporated by reference in their entirety.

TECHNICAL FIELD

This disclosure relates to a magnetic devices that utilize thin films with perpendicular magnetic anisotropy (PMA) and a method for making the same, and in particular, to increasing Hc and thermal stability in the resulting multilayer magnetic stack to survive high temperature semiconductor processes up to 400° C.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry. The STO comprises a stack including a spin injection layer (SIL) with PMA character, an oscillating field generation layer (FGL) with in-plane anisotropy, and a spacer between the SIL and FGL.

Both MRAM and STT-MRAM may have a MTJ element based on a tunneling magneto-resistance (TMR) effect wherein a stack of layers has a configuration in which two ferromagnetic layers typically referred to as a reference layer and free layer are separated by a thin non-magnetic dielectric layer. The MTJ element is typically formed between a bottom electrode such as a first conductive line and a top electrode which is a second conductive line at locations where the top electrode crosses over the bottom electrode in a MRAM device. In another aspect, a MTJ element in a read head sensor may be based on a giant magnetoresistance (GMR) effect that relates to a spin valve structure where a reference layer and free layer are separated by a metal spacer. In sensor structures, the MTJ is formed between two shields and there is a hard bias layer adjacent to the MTJ element to provide longitudinal biasing for stabilizing the free layer magnetization.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-MRAM (STT-MRAM), a high $\lambda_S$ and high Hc leads to high anisotropy for greater thermal stability.

When a memory element uses a free layer with a magnetic moment lying in the plane of the film, the current needed to change the magnetic orientation of a magnetic region is proportional to the net polarization of the current, the volume, magnetization, Gilbert damping constant, and anisotropy field of the magnetic region to be affected. The critical current ($i_C$) required to perform such a change in magnetization is given in equation (1):

$$i_c = \frac{\alpha e V M s}{g \hbar}\left[H_{k_{eff},\|} + \frac{1}{2}H_{k_{eff},\perp}\right] \quad (1)$$

where e is the electron charge, $\alpha$ is a Gilbert damping constant, Ms is the saturation magnetization of the free layer, $\hbar$ is the reduced Plank's constant, g is the gyromagnetic ratio, $H_{k_{eff},\|}$ is the in-plane anisotropy field, and $H_{k_{eff},\perp}$ is the out-of-plane anisotropy field of the magnetic region to switch, and V is the volume of the free layer. For most applications, the spin polarized current must be as small as possible.

The value $\Delta = kV/k_B T$ is a measure of the thermal stability of the magnetic element. If the magnetization lies in-plane, the value can be expressed as shown in equation (2):

$$\Delta = \frac{M_S V H_{k_{eff},\|}}{2 k_B T} \quad (2)$$

where $k_B$ is the Boltzmann constant and T is the temperature.

Unfortunately, to attain thermal stability of the magnetic region, a large net magnetization is required which in most cases would increase the spin polarized current necessary to change the orientation of the magnetic region.

When the free layer has a magnetization direction perpendicular to the plane of the film, the critical current needed to switch the magnetic element is directly proportional to the perpendicular anisotropy field as indicated in equation (3):

$$i_c = \frac{\alpha e M s V H_{k_{eff},\perp}}{g \hbar} \quad (3)$$

The parameters in equation (3) were previously explained with regard to equation (1).

Thermal stability is a function of the perpendicular anisotropy field as shown in equation (4):

$$\Delta = \frac{M_S V H_{k_{eff},\perp}}{2 k_B T} \quad (4)$$

In both in-plane and out-of-plane configurations, the perpendicular anisotropy field of the magnetic element is expressed in equation (5) as:

$$H_{k_{eff},\perp} = -4\pi M_s + \frac{2K_U^{\perp,s}}{M_s d} + H_{k,\chi,\perp} \quad (5)$$

where $M_s$ is the saturation magnetization, d is the thickness of the magnetic element, $H_{k,\chi,\perp}$ is the crystalline anisotropy field in the perpendicular direction, and $K_U^{\perp,s}$ is the surface perpendicular anisotropy of the top and bottom surfaces of the magnetic element. In the absence of strong crystalline anisotropy, the perpendicular anisotropy field of a magnetic layer is dominated by the shape anisotropy field on which little control is available. At a given thickness, lower magnetization saturation decreases shape anisotropy and the spin-polarized switching current but also decreases thermal stability which is not desirable. Therefore, an improved configuration for a magnetic element is needed that provides improved thermal stability for a free layer with perpendicular magnetic anisotropy.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Magnin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability. Even as magnetic tunnel junctions (MTJs) lower the switching current by minimizing the demagnetization term, they provide a high energy barrier (Eb) due to the large perpendicular anisotropy maintained at small (<100 nm) junctions. Out of plane magnetic anisotropy begins to degenerate at annealing temperatures greater than about 350° C. and current thin films completely lose PMA character after 400° C. annealing processes. Thus, there is a significant challenge to increase PMA and enhance thermal stability of free layers to improve the performance of MTJs at elevated temperatures typical of back end of line (BEOL) semiconductor processes. Current technology fails to provide high Hc and thermal stability in a free layer with PMA character that will withstand high temperature processing up to at least 400° C. which is required in semiconductor fabrication methods. Therefore, an improved MTJ stack with a free layer having thermal stability to 400° C. and that exhibits PMA is needed for magnetic device applications.

SUMMARY

One objective of the present disclosure is to provide a MTJ stack in a magnetic device that has a free layer with PMA and thermal stability to withstand annealing and back end of line (BEOL) processes that typically reach 400° C. or higher.

A second objective of the present disclosure is to provide a MTJ stack of layers according to the first objective that also has high magnetoresistance and a thermal stability factor ($\Delta$) that are suitable for spintronic applications such as spin-torque MRAM (STT-MRAM), and microwave assisted magnetic recording (MAMR).

According to one embodiment of the present disclosure, these objectives are achieved with a magnetic tunnel junction (MTJ) configuration comprising a reference (pinned) layer, a ferromagnetic free layer with a CoFeB composition or the like, a tunnel barrier formed between the reference and free layers, and a capping layer formed on a top surface of the free layer in a bottom spin valve configuration. Additional layers may be included such as a seed layer at the bottom of the MTJ stack that is capable of maintaining or enhancing PMA in an overlying reference layer or free layer. Preferably, the thickness of the free layer should be less than about 20 Angstroms thick to enable perpendicular magnetic anisotropy (PMA) in the free layer. In one aspect, the reference layer also has PMA character and may be made of (Co/Ni)n laminates or the like, $L1_0$ ordered alloys such as FePt, CoPt, FePd, NiPt, FeNi, FeCu, MnAl, MnPt, MnPd, CuAu, or rare earth-transition metal (RE-TM) films including TbFeCo and GdFeCo. The tunnel barrier may be any oxide layer such as MgO, $Al_2O_3$, TiOx, or HfOx that induces a spin dependent tunneling effect between the free layer and reference layer. The capping layer is a metal layer or oxide that induces or enhances out-of-plane anisotropy in the free layer in a bottom spin valve configuration.

According to a preferred embodiment, a first dusting layer made of B or a B alloy such as $Co_{100-x}B_x$ or $Fe_{100-x}B_x$ where x is >85 atomic % contacts a bottom surface of the free layer. A second dusting layer made of B or a B alloy contacts a top surface of the free layer. Each dusting layer has a thickness between 0.2 and 20 Angstroms, and preferably between 0.2 and 10 Angstroms. In a top spin valve configuration, the first dusting layer is formed between a seed layer, for example, and the free layer while the second dusting layer is between the free layer and tunnel barrier layer. For a bottom spin valve configuration, the first dusting layer is between the tunnel barrier layer and free layer while the second dusting layer is formed between the free layer and capping layer. The dusting layers may be deposited at room temperature or at an elevated temperature up to 400° C. Subsequently, an anneal up to 400° C. or higher, and preferably 400° C., may be employed to further improve PMA properties and thereby increase Hc and Hk. Furthermore, the dusting layers improve thermal stability of the free layer.

In an alternative embodiment, a non-magnetic metal (M) layer may be inserted within the free layer to give a FL1/M/FL2 configuration wherein M is one of Ta, Al, Cu, Zr, Mg, Mo, or another non-magnetic metal, and FL1 and FL2 are bottom and top layers, respectively, in a composite free layer structure. In this case, a bottom spin valve stack preferably has a substrate/reference layer/tunnel barrier/DL1/FL1/M/FL2/DL2/cap layer configuration where DL1 and DL2 are first and second dusting layers, respectively.

DETAILED DESCRIPTION

The present disclosure is a magnetic structure with a free layer sandwiched between two boron or boron containing dusting layers to provide a combination of perpendicular magnetic anisotropy and thermal stability to at least 400° C. which is suitable for applications such as MRAM and STT-MRAM, spintronic devices such as MAMR, and various designs of PMA spin valves including MTJ elements. Although the ferromagnetic layer having PMA is depicted as a free layer in the embodiments described herein, the ferromagnetic layer sandwiched between two B dusting layers may also be employed as a reference layer, pinned layer, or dipole (offset-compensation) layer as appreciated by those skilled in the art.

In related patent application Ser. No. 13/406,972, we disclosed a magnetic structure wherein dusting layers such as Co or CoFe may be inserted in a ferromagnetic layer comprised of (Ni/Co) laminates or the like, $L1_0$ ordered alloys, or in rare earth-transition metal (RE-TM) films to improve PMA and thermal properties. In the aforementioned scheme, dusting layers are sandwiched around a coupling layer to improve RKKY coupling in a synthetic antiferromagnetic (SAF) structure. A preferred configuration is RL1/D1/coupling layer/D2/RL2 where RL1 and RL2 are reference layers and D1 and D2 are dusting layers. Subsequently, we disclosed in related patent application Ser. No. 13/409,456 that dusting layers may be used to enhance PMA and thermal stability in other ferromagnetic layers represented by $Co_RFe_SNi_WB_T$ where R, S, W, and T are the content of Co, Fe, Ni, and B, respectively, R+S+W+T=100, S>(R+W), and T is in the range of 25 to 40 atomic %. In particular, dusting layers made of Co, Fe, or Ni, or alloys thereof such as NiFe, CoFe, CoTa, CoZr, CoHf, CoMg, CoNb, $CoB_V$, or $FeB_V$ where v is from 0 to 40 atomic % were found to be effective in leading to a thermal stability of at least 400° C. while maintaining substantial PMA character in magnetic tunnel junction (MTJ) structures. Now we have discovered that the dusting layer composition may be expanded to boron itself and alloys thereof wherein the B content is greater than 85 atomic %.

Figure 1:
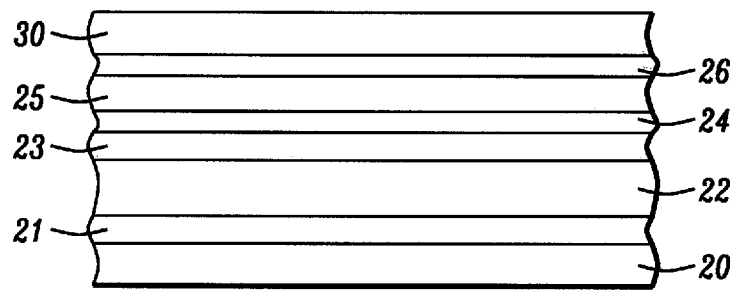
FIG. 1 is a cross-sectional view of a MTJ with a bottom spin valve design and a seed layer/reference layer/tunnel barrier/DL1/free layer/DL2/cap layer configuration according to an embodiment of the present disclosure.

Referring to FIG. 1, a first embodiment of the present disclosure is depicted wherein a seed layer 21, reference layer 22, tunnel barrier 23, first dusting layer (DL1) 24, free layer 25, second dusting layer (DL2) 26, and capping layer 30 are sequentially formed on a substrate 20 in a bottom spin valve configuration. All layers in the MTJ comprised of layers 21-26 and capping layer 30 may be sputter deposited in a sputter deposition mainframe that has at least one oxidation chamber and an etching chamber. In one aspect, the MTJ is part of a MRAM or STT-MRAM structure. Preferably, reference layer 22 has PMA with a fixed magnetization in a direction perpendicular to the plane of the substrate. However, the reference layer may also have in-plane magnetization. The free layer 25 has PMA in a direction perpendicular to the plane of the substrate, and in the preferred embodiment is in a direction parallel or anti-parallel to that of the reference layer to give a 1 or 0 memory state. The substrate may be a bottom electrode in a MRAM, STT-MRAM, or spin transfer oscillator (STO), or a bottom shield in a sensor, for example. In a STO device, the reference layer 22 serves as a spin injection layer and free layer 25 functions as a field generation layer. Seed layer 21 is optional but is advantageously used to maintain or enhance PMA in reference layer 22 and facilitates smooth and uniform crystalline growth in the overlying MTJ layers. The seed layer may be a single layer or composite made of NiCr, Pd, Pt, Ta, Ru or other metals or alloys.

Reference layer 22 may be a laminated structure such as $(Co/Ni)n$, $(Co/Pd)n$, $(Co/Pt)n$, or other laminated stacks exhibiting PMA where the lamination number n is between 2 and 30, and preferably from 4 to 10. The present disclosure also anticipates that one or more of the laminated layers may be an alloy wherein CoFe or CoFeB are employed as a replacement for Co, and NiCo, NiFe, or NiFeB are selected as a replacement for Ni. Thus, (CoFe/Ni), (CoFeB/Ni)n, (Co/NiFe)n, (Co/NiFeB)n, and (Co/NiCo)n are alternatives for the reference layer. Typically, each Co or Co alloy layer in the laminates has a thickness between 0.5 and 5 Angstroms while each Pd, Pt, Ni, or Ni alloy layer has a thickness from 2 to 10 Angstroms. Preferably, the Co or Co alloy layer is thinner than the Ni, Ni alloy, Pt, or Pd layer. In another embodiment, reference layer 22 may be comprised of an $L1_0$ ordered alloy such as FePt, CoPt, FePd, NiPt, FeNi, FeCu, MnAl, MnPt, MnPd, CuAu, and the like that has PMA character. In yet another embodiment, the reference layer may be made of a RE-TM film with PMA character such as TbFeCo or GdFeCo.

The present disclosure also encompasses an embodiment wherein the reference layer has a synthetic anti-ferromagnetic (SAF) structure with a coupling layer such as Ru formed between two reference layers RL1 and RL2 with PMA, and between two dusting layers D1 and D2 to give a RL1/D1/coupling layer/D2/RL2 configuration as previously described in related patent application Ser. No. 13/406,972.

In an embodiment wherein the reference layer has perpendicular magnetic anisotropy (PMA), there may be a transition layer (not shown) formed between the reference layer 22 and tunnel barrier layer 23. The transition layer may be comprised of CoFeB, CoFe, or composites thereof, or with Co such as CoFeB/Co, and is beneficial in magnetic device designs where the reference layer is part of a MTJ and interfaces with a tunnel barrier layer made of an oxide. According to a preferred embodiment, the transition layer is formed between a reference layer with PMA and a (100) MgO tunnel barrier, for example, and is sufficiently thin to preserve the PMA property of the reference layer 22 and yet thick enough to provide a high magnetoresistance (MR) ratio. With regard to a CoFeB/Co transition layer, the CoFeB portion may be from 4 to 8 Angstroms thick, and preferably 6 Angstroms, while the Co layer portion is from 3 to 5 Angstroms, and preferably 4 Angstroms thick. Co may be used as the upper layer in the transition layer stack and the interface with the tunnel barrier layer since it is more resistant to oxidation than a CoFeB (or CoFe) layer.

The tunnel barrier layer 23 may be any oxide layer that induces a spin dependent tunneling effect between the reference layer and free layer. For example, MgO, $Al_2O_3$, TiOx, ZnO, HfOx, or other metal oxides or metal nitrides, or laminations of one or more of the aforementioned materials may be selected as the tunnel barrier in a MTJ with a tunnel magnetoresistance (TMR) configuration.

A key feature is that the free layer 25 has a bottom surface that contacts a first dusting layer and a top surface which contacts a second dusting layer. Optionally, one of the two dusting layers may be omitted but it should be understood that a single dusting layer does not provide the full advantage in terms of improved thermal stability and maintaining high PMA in the free layer as achieved with two dusting layers. The free layer may be CoFe, Co, CoFeB, or a CoFeB alloy such as CoFeNiB, for example. In one aspect, the free layer is a single layer having a thickness from 5 to 20 Angstroms. With thicknesses greater than about 30 Angstroms, the free layer tends to have in-plane magnetization. It should be understood that interfacial perpendicular anisotropy is established between oxide and magnetic metal. Thus, when a free layer, which normally has in-plane magnetization, adjoins or is formed proximate to an oxide layer such as a MgO tunnel barrier, the magnetization of the free layer can be aligned out-of-plane under conditions where interfacial perpendicular anisotropy exceeds the shape anisotropy field for the magnetic layer. Note that the thickness of free layer 25 is represented by "d" in equation (5) presented previously. Thus, as the value for "d" is reduced, the perpendicular anisotropy field increases.

The shape anisotropy field for a $Co_{20}Fe_{50}B_{20}$ free layer is approximately 12000 Oe. Depending on the composition of a CoFeB or CoFeB alloy free layer, we have found interfacial perpendicular anisotropy may be greater than 12000 Oe by maintaining thicknesses in the 5 to 20 Angstrom range. Under such conditions, an out-of-plane magnetization (perpendicular anisotropy) is established in the free layer. If the free layer thickness is above about 19-20 Angstroms, then the shape anisotropy field is too large to be overcome by an out-of plane component, and the magnetization of the free layer remains in-plane. In an embodiment wherein the top surface of the free layer is formed in close proximity to a capping layer made of an oxide, then interfacial perpendicular anisotropy is also established along the top surface of the free layer which further enhances PMA in free layer 25.

In a preferred embodiment, a first dusting layer (DL1) 24 is formed between the tunnel barrier 23 and free layer 25 and a second dusting layer (DL2) 26 is positioned between the free layer and cap layer 30. DL1 and DL2 are made of B, or a B alloy such as CoB or FeB wherein the B content is >85 atomic %, and have a thickness from 0.2 to 20 Angstroms and preferably between 0.2 and 10 Angstroms. Note that the DL1 composition and thickness is not necessarily equal to the DL2 composition and thickness. DL1 and DL2 thicknesses are minimized to avoid a significant reduction in the influence of the tunnel barrier layer and cap layer to induce PMA in the free layer. The Ku (anisotropy constant) for the free layer impacts the Eb (energy barrier) of the memory cell and it is believed that inserting dusting layers 24, 26 also increases the PMA Ku of the free layer thereby increasing Eb and enhancing the retention time of STT-MRAM designs. The dusting layers may be deposited at room temperature or at elevated temperatures up to 400° C. and can be used as deposited or after an additional anneal at 400° C. or higher, and preferably about 400° C., once all the MTJ layers are deposited. The present disclosure also anticipates that one or both of the DL1 and DL2 layer may be a composite comprising a plurality of boron containing dusting layers in a laminated structure.

Another important factor to consider when selecting the thickness of DL1 and DL2 layers is that thickness is dependent on the adjoining free layer composition. It is believed that a moderate B concentration in the dusting layer between the tunnel barrier and free layer, and between the free layer and cap layer is a key parameter for thermal stability enhancement. In other words, if a $Co_{20}Fe_{60}B_{20}$ free layer is replaced by a $Co_{20}Fe_{50}B_{30}$ free layer, the thickness of a B dusting layer or the thickness and B content in a CoB or FeB dusting layer may be reduced accordingly. The thickness of a CoB or FeB dusting layer is also minimized to avoid adding a significant moment to the free layer magnetization which would lead to a lower PMA magnitude.

A capping layer 30 is formed as the uppermost layer in the MTJ stack and may be comprised of one or more of Ta, Ru, Cu, Cr, or other metals that induce interfacial perpendicular anisotropy in the free layer. In another aspect, the capping layer is an oxide of a single element or an oxide of an alloy such as MgTaOx, MgZrOx, MgHfOx, MgNbOx, MgO, SiOx, SrTiOx, BaTiOx, CaTiOx, LaAlOx, MnOx, VOx, $Al_2O_3$, TiOx, BOx, and HfOx, and is preferably MgTaOx where the Mg:Ta ratio is from about 2:1 to 1:1. The capping layer may also be a lamination of one or more of the aforementioned oxides. A MgTaOx cap layer is fabricated by first sputter depositing a MgTa layer with a thickness from 2 to 10 Angstroms, or depositing a Mg layer followed by a Ta layer to give a Mg/Ta stack. Then, either a radical (ROX) oxidation or natural (NOX) oxidation may be employed as a second step. A NOX process is preferred in cases where the RA (resistance×area) value must be minimized to improve performance. Although a metal oxide cap is preferred over a metal cap in terms of inducing higher PMA in the free layer, the metal oxide cap does contribute to the overall RA value for the MTJ which means the thickness of a MgTaOx layer, for example, must be minimized to avoid a higher than desired RA. Moreover, MgTaOx is preferred over MgO for the capping layer since the former contributes a lower RA value than an equivalent thickness of MgO.

Figure 2:
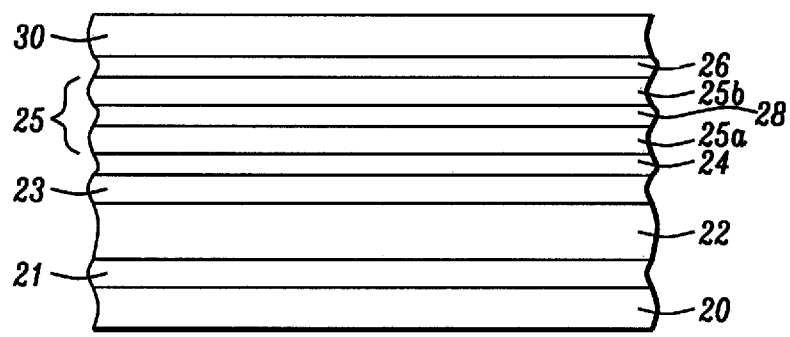
FIG. 2 is a cross-sectional view of a MTJ with a bottom spin valve design with a seed layer/reference layer/tunnel barrier/DL1/composite free layer/DL2/cap layer configuration according to another embodiment of the present disclosure.

According to a second embodiment depicted in FIG. 2, a non-magnetic metal is inserted in the free layer. As a result, the free layer 25 configuration is now FL1/M/FL2 where the metal (M) layer 28 is Ta, Al, Cu, Zr, Hf, Nb, Mg, or Mo, and the free layer is comprised of a lower FL1 layer 25a that contacts a top surface of the first dusting layer 24 and an upper FL2 layer 25b that interfaces with a bottom surface of the second dusting layer 26. The M layer serves as a moment dilution layer and has a thickness from 0.5 to 10 Angstroms, and preferably between 1 and 5 Angstroms. In other words, for a fixed free layer thickness, a CoFeB/M/CoFeB configuration, for example, will have less in-plane magnetization than a single CoFeB free layer. It follows that interfacial perpendicular anisotropy in the lower portion of the FL1 layer 25a, and in the upper portion of the FL2 layer 25b more easily overcomes the shape anisotropy field and generates substantial PMA in the free layer. In this embodiment, capping layer 30 is preferably comprised of a metal oxide as previously described, and more preferably is made of MgTaOx in order to enhance the interfacial perpendicular anisotropy in the FL2 layer 25b while minimizing the resistance×area (RA) value. Each of the FL1 and FL2 layers 25a, 25b has a thickness from 5 to 14 Angstroms.

Figure 3:
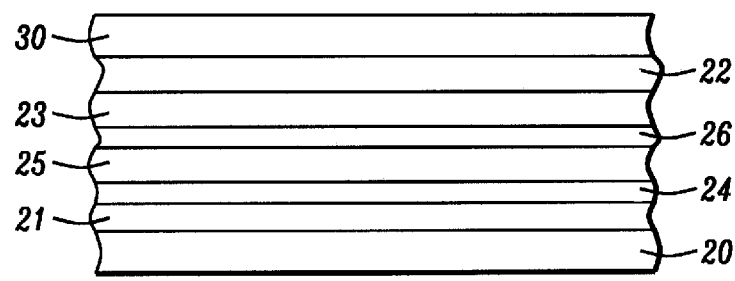
FIG. 3 is a cross-sectional view of a MTJ with a top spin valve design and a seed layer/DL1/free layer/DL2/tunnel barrier/reference layer/cap layer configuration according to an embodiment of the present disclosure.

Referring to FIG. 3, the present disclosure also encompasses an embodiment with a top spin valve design wherein the first dusting layer 24, free layer 25, second dusting layer 26, tunnel barrier 23, reference layer 22, and capping layer 30 are consecutively formed on seed layer 21. As described previously, the free layer 25 may be a single layer made of CoFe, Co, CoFeB or a CoFeB alloy such as CoFeNiB. Thus, the DL1, free layer, and DL2 layers are sequentially deposited on the seed layer prior to forming the tunnel barrier. One or both of the DL1 and DL2 layers may be a laminated structure with a plurality of dusting layers. Optionally, one of the dusting layers 24, 26 may be omitted although the resulting improvement in free layer thermal stability will not be as great as when both dusting layers are present.

Figure 4:
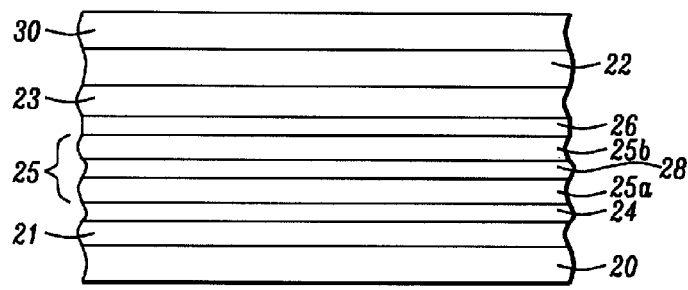
FIG. 4 is a cross-sectional view of the MTJ configuration in FIG. 3 where the free layer has an insertion layer according to an embodiment of the present disclosure.

Referring to FIG. 4, an embodiment is depicted wherein a top spin valve structure further comprises a non-magnetic M layer within the free layer as described earlier. In this case, the first dusting layer 24, FL1 layer 25a, M layer 28, FL2 layer 25b, second dusting layer 26, tunnel barrier 23, reference layer 22, and capping layer 30 are sequentially formed on a seed layer 21.

Once all of the layers in the multilayer stack and MTJ are formed, an annealing process may be performed that is comprised of a temperature between 200° C. and 500° C., and preferably between 300° C. and 400° C., for a period of 1 minute to 10 hours. Thereafter, the MTJ stack may be patterned to form a plurality of MRAM (or STT-MRAM) memory cells or STO elements by a well known photolithography and etch sequence on the substrate 20. In an embodiment where the substrate is a bottom electrode, the bottom electrode may be patterned simultaneously with the overlying multilayer stack to enable a higher density of patterned structures for advanced technology designs.

Example 1

A series of unpatterned partial MTJ stacks was fabricated and the PMA property for each was measured with a vibrating sample magnetometer (VSM) in order to demonstrate the benefits of the present disclosure. Each of the partial stacks has a lower MgO layer, a middle free layer, and an upper capping layer. In sample A that includes a conventional free layer, the $Co_{20}Fe_{60}B_{20}$ free layer is 12 Angstroms thick and the capping layer is a 50 Angstrom thick Ta layer. Sample B is similar to sample A except a first boron dusting layer having a 0.5 Angstrom thickness is inserted between the MgO layer and free layer, and a second boron dusting layer also 0.5 Angstroms thick is formed between the free layer and Ta capping layer according to an embodiment of the present disclosure. Sample C has a MgTaOx capping layer and includes a conventional free layer with a CoFeB/Ta/CoFeB configuration wherein the CoFeB layers are 8 Angstroms thick and the Ta insertion layer is 1.5 Angstroms thick. Sample D is similar to sample C except first and second dusting layers each 0.5 Angstroms thick are formed between the MgO and lower CoFeB layer and between the upper CoFeB layer and capping layer, respectively, according to an embodiment of the present disclosure. In samples C and D, the MgTaOx capping layer is prepared by depositing a 4 Angstrom thick Mg layer on the free layer followed by depositing a 3 Angstrom thick Ta layer on the Mg layer and then performing a natural oxidation (NOX) process. All layers were deposited at room temperature and the partial MTJ stack was annealed at 400° C. for 1 hour.

Figure 5A:
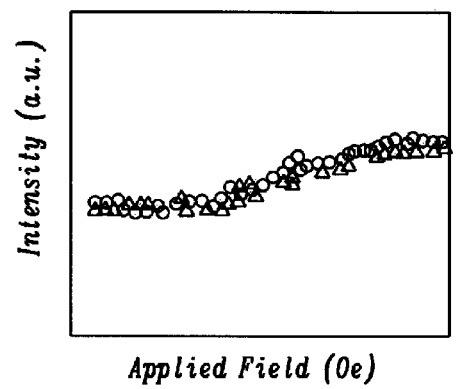
FIG. 5a and FIG. 5c show the absence of PMA for a partial MTJ stack without dusting layers formed along top and bottom surfaces of a free layer.
Figure 5B:
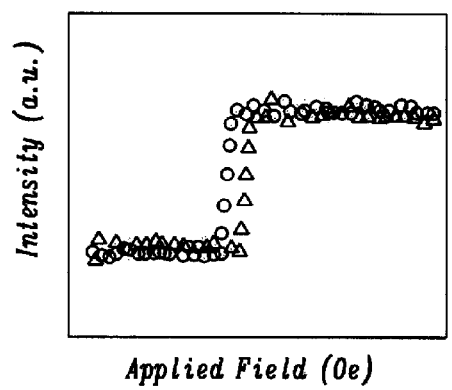
FIG. 5b and FIG. 5d show substantial PMA character for a partial MTJ stack with B dusting layers contacting top and bottom surfaces of a free layer according to embodiments of the present disclosure.
Figure 5C:
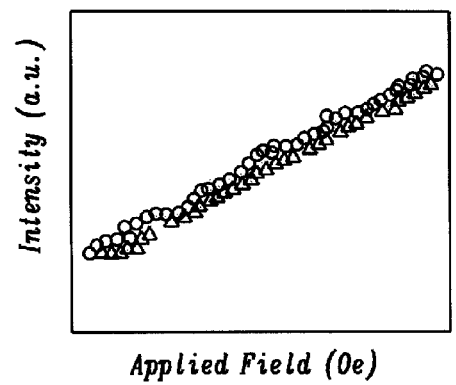
Figure 5D:
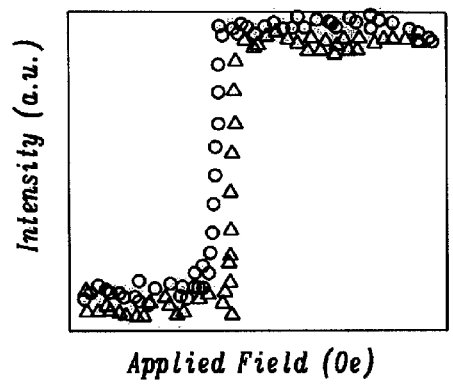

As shown in FIG. 5a and FIG. 5c, PMA for samples A and C, respectively, is lost after the high temperature anneal at 400° C. PMA character is present for samples A and C following a 300° C. anneal but is essentially lost after a 350° C. anneal (not shown). On the other hand, there is considerable PMA character in sample B (FIG. 5b) and in sample D (FIG. 5d) even after a 400° C. anneal. These results prove that PMA of a free layer can be maintained at a substantial magnitude by including a B dusting layer between the free layer and tunnel barrier layer, and between the free layer and capping layer according to embodiments described herein.

The benefits of the present disclosure are an improved PMA at process temperatures up to at least 400° C. or higher for a free layer in a magnetic device with increased Ku that will increase the retention time for a memory cell. These results are achieved by forming a B or B containing dusting layer along one or both of top and bottom surfaces of a free layer. A non-magnetic moment dilution layer may be inserted within the free layer to further improve PMA. Thus, the MTJ stacks described herein are suitable for a variety of applications including advanced STT-MRAM devices. Furthermore, the processes and materials described herein are compatible with the design and processing requirements of magnetic devices.

While this disclosure has been particularly shown and described with reference to, the preferred embodiment thereof, it will be understood by those skilled in the art that various changes in form and details may be made without departing from the spirit and scope of this disclosure.

We claim:

1. A multilayer stack with thermal stability to at least 400° C. in a magnetic device, comprising:
   (a) a reference layer;
   (b) a free layer with perpendicular magnetic anisotropy (PMA) and having a top surface and a bottom surface;
   (c) a tunnel barrier layer formed between the reference layer and free layer; and
   (d) at least one dusting layer made of boron or a boron alloy having a B content greater than about 85 atomic % that contacts the bottom surface of the free layer in a bottom spin valve configuration, or the at least one dusting layer contacts the top surface of the free layer in a top spin valve configuration.

2. The multilayer stack of claim 1 wherein the free layer has a CoFe, Co, CoFeB, CoFeNiB, or CoFeB alloy composition and a thickness from about 5 to 20 Angstroms.

3. The multilayer stack of claim 1 wherein the free layer is further comprised of a non-magnetic layer (M) made of Ta, Al, Cu, Zr, Nb, Hf, Mg, or Mo and having a thickness of about 0.5 to 10 Angstroms to give a FL1/M/FL2 configuration wherein FL1 is a bottom portion of the free layer that contacts the at least one dusting layer.

4. The multilayer stack of claim 1 wherein the at least one dusting layer is B, CoB, or FeB and has a thickness from about 0.2 to 20 Angstroms.

5. The multilayer stack of claim 1 wherein the at least one dusting layers is a composite comprising a laminated structure of boron containing dusting layers.

6. The multilayer stack of claim 1 further comprised of a capping layer as an uppermost layer in the multilayer stack, the cap layer is a metal layer or a metal oxide layer.

7. The multilayer stack of claim 1 wherein the reference layer exhibits PMA, a magnetization direction thereof is parallel or anti-parallel to the PMA in the free layer to establish either a 1 or 0 memory state in the multilayer stack.

8. A magnetic tunnel junction (MTJ) with thermal stability to at least 400° C., comprising:
   (a) a seed layer formed on a substrate;
   (b) a reference layer;
   (c) a free layer with perpendicular magnetic anisotropy (PMA) and having a top surface and a bottom surface;
   (d) a tunnel barrier layer formed between the reference layer and free layer; and
   (e) a first dusting layer and a second dusting layer made of boron or a boron alloy having a B content greater than about 85 atomic % wherein the first dusting layer contacts the bottom surface of the free layer and the second dusting layer contacts the top surface of the free layer.

9. The MTJ of claim 8 wherein the MTJ is a bottom spin valve structure and further comprises a capping layer in which the seed layer, reference layer, tunnel barrier, first dusting layer, free layer, second dusting layer, and capping layer are sequentially formed on the substrate.

10. The MTJ of claim 9 wherein the capping layer comprises one or more of Ta, Ru, Cu, or Cr, or is MgTaOx, MgHfOx, MgNbOx, MgZrOx, MgO, SiOx, SrTiOx, BaTiOx, CaTiOx, LaAlQx, MnOx, VOx, $Al_2O_3$, TiOx, BOx, HfOx, or a lamination of one or more of the aforementioned oxides.

11. The MTJ of claim 8 wherein the free layer is further comprised of a non-magnetic layer (M) made of Ta, Al, Cu, Zr, Hf, Nb, Mg, or Mo and has a thickness of about 0.5 to 10 Angstroms to give a FL1/M/FL2 configuration wherein FL1 is a bottom portion of the free layer that contacts the first dusting layer and FL2 is an upper portion of the free layer that contacts the second dusting layer.

12. The MTJ of claim 11 wherein each of the FL1 and FL2 layers has a thickness between about 5 and 14 Angstroms.

13. The MTJ of claim 8 wherein the free layer has a CoFe, Co, CoFeB, CoFeNiB, or CoFeB alloy composition and a thickness from about 5 to 20 Angstroms.

14. The MTJ of claim 8 wherein the first and second dusting layers are B, CoB, or FeB and each have a thickness from about 0.2 to 20 Angstroms.

15. The MTJ of claim 8 wherein the MTJ is a top spin valve structure and further comprises a capping layer in which the seed layer, first dusting layer, free layer, second dusting layer, tunnel barrier layer, reference layer, and capping layer are sequentially formed on the substrate.

16. The MTJ of claim 8 wherein the reference layer exhibits PMA, a magnetization direction thereof is parallel or anti-parallel to the PMA in the free layer to establish either a 1 or 0 memory state in the MTJ.

17. The multilayer stack of claim 8 wherein one or both of the first dusting layer and the second dusting layer is a composite comprising a laminated structure of boron containing dusting layers.

\* \* \* \* \*